United States Patent [19]
Hshieh et al.

[11] Patent Number: 6,104,060
[45] Date of Patent: *Aug. 15, 2000

[54] COST SAVINGS FOR MANUFACTURING PLANAR MOSFET DEVICES ACHIEVED BY IMPLEMENTING AN IMPROVED DEVICE STRUCTURE AND FABRICATION PROCESS ELIMINATING PASSIVATION LAYER AND/OR FIELD PLATE

[75] Inventors: Fwu-Iuan Hshieh, Saratoga; True-Lon Lin, Cupertino, both of Calif.

[73] Assignee: MegaMOS Corporation, San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/603,638

[22] Filed: Feb. 20, 1996

[51] Int. Cl.[7] .......................... H01L 27/108; H01L 29/76; H01L 23/58
[52] U.S. Cl. .......................... 257/329; 257/339; 257/491; 257/494
[58] Field of Search ..................... 257/329, 337, 257/339, 341, 342, 488, 489, 490, 491, 640, 641, 494

[56] References Cited

U.S. PATENT DOCUMENTS

| | | | |
|---|---|---|---|
| 4,633,292 | 12/1986 | Fellinger et al. | 257/339 |
| 5,521,409 | 5/1996 | Hshieh et al. | 257/341 |

FOREIGN PATENT DOCUMENTS

| | | | |
|---|---|---|---|
| 1197023 | 11/1985 | Canada | 257/341 |
| 60-42859 | 3/1985 | Japan | 257/640 |

*Primary Examiner*—Steven H. Loke
*Attorney, Agent, or Firm*—Bo-In Lin

[57] ABSTRACT

Improved power MOSFET structure, and fabrication process are disclosed in this invention to achieve cost savings by simplified device structure and fabrication processes, and also by reducing the required die size. Specifically, in a novel MOSFET device, insulation of mobile ions are achieved by extending the poly gate and metal contacts such that the passivation layer is no longer required and the fabrication process is simplified such that the MOSFET device can be manufactured at a lower price. Furthermore, in another MOSFET device, the gate runner is used to replace the field plate such that the requirement of a field plate as that in a conventional MOSFET device is also eliminated and, by reducing the die size, the cost of manufacture is further reduced.

1 Claim, 11 Drawing Sheets

COST SAVINGS FOR MANUFACTURING PLANAR MOSFET DEVICES ACHIEVED BY IMPLEMENTING AN IMPROVED DEVICE STRUCTURE AND FABRICATION PROCESS ELIMINATING PASSIVATION LAYER AND/OR FIELD PLATE

BACKGROUND OF THE INVENTION

1. Field of the Invention

This invention relates generally to the structure and fabrication process of planar power MOSFETs. More particularly, this invention relates to a novel and improved structure and process for fabricating a power MOSFET device without a passivation layer and the field plate for manufacturing MOSFET devices at lower cost.

2. Description of the Prior Art

For a conventional power metal oxide silicon field effect transistor (MOSFET) device, the requirement for employing a passivation layer for preventing the device from being physical damaged and for insulating from mobile ions leads to more complicate fabrication process and a higher production cost. Specifically, the device structure of a conventional MOSFET leaves several openings which are exposed if not protected by a passivation layer. These openings are vulnerable to physical damages and mobile ion contamination. Protection by the use of passivation layer is therefore required for the conventional device structure.

For the purpose of better understanding the limitations encountered in the prior art, general descriptions for the techniques currently employed for fabricating power MOSFET devices are first discussed as background information. FIG. 1 shows a typical vertical double diffused MOS (VDMOS) device which uses a double diffusion technique to control the channel length l. Two successive diffusions are performed with first a p diffusion using boron, then a n diffusion using either arsenic or phosphorous, to produce two closely spaced pn junctions at different depths below the silicon surface. With this pn junction, as shown in FIG. 1, the VDMOS supports the drain voltage vertically in the n⁻ epilayer. The current flows laterally from the source through the channel, parallel to the surface of the silicon. The current flow then turns through a right angle to flow vertically down through the drain epilayer to the substrate and to the drain contact. The p-type "body" region in which the channel is formed when a sufficient positive voltage is applied, and the n⁺ source contact regions are diffused successively through the same window etched in the oxide layer. The channel length can be controlled through the processing steps. Because of the relative doping concentrations in the diffused p- channel region and the n- layer, the depletion layer which supports $V_{DS}$, a drain to source voltage, extends down into the epilayer rather than laterally into the channel.

In order to best utilize the silicon, the power MOSFET device is fabricated by employing a cellular structure as that shown in FIGS. 2A and 2B. Several different schemes are used. High current capability is obtained by connecting many cells together in parallel as will be discussed below. As shown in FIG. 2B, heavily doped poly-crystalline silicon is used as gate electrode. For power MOSFETs, it has several advantages because it simplifies the connection metalization process where an oxide layer can be formed over the poly-silicon and the source metalization may then be extended over the whole of the upper surface. The poly silicon, used as gate electrodes, can be deposited with great accuracy and the gate oxide is more stable and less prone to contamination than the aluminum gate. Furthermore, the source is self aligned automatically with the gate edge thus greatly simplifies the fabrication process.

A cross sectional view of a conventional planar cellular structure of power MOSFETs, for different topologies such as square, circular, and hexagonal cell arrangements, is shown in FIG. 3. A power MOSFET device 10 as shown has to be protected by a passivation layer which is typically a PECVD nitride or a PSG passivation layer 15. The passivation layer 15 is necessary to serve as a barrier to block the mobile ions. As shown in FIG. 3, the possible contamination openings A, B, C, other than the source (S), gate (G), the field plate (FP), and the equal potential ring (EQR) surface areas, are protected by the nitride layer 15. Cost savings in manufacturing power MOSFET devices are limited by this conventional structure due to the requirements that a passivation layer and field plate are necessary with this type of device structure, thus involving additional processing steps and adversely impacting the production costs.

Therefore, there is still a need in the art of power device fabrication, particularly for power MOSFET design and fabrication, to provide a structure and fabrication process that would resolve these limitations.

SUMMARY OF THE PRESENT INVENTION

It is therefore an object of the present invention to provide an improved MOSFET structure, and fabrication process to overcome the aforementioned limitations encountered in the prior art.

Specifically, it is an object of the present invention to provide an improved MOSFET structure and fabrication process wherein a passivation layer is no longer required such that the fabrication process is simplified and the MOSFET device can be manufactured at a lower price.

Another object of the present invention is to provide an improved MOSFET structure and fabrication process where the requirement of a field plate as that in a conventional MOSFET device can be eliminated such that the cost of manufacture can be further reduced.

Briefly, in a preferred embodiment, the present invention includes a MOSFET device formed in a semiconductor chip with a top surface and a bottom surface. The MOSFET device includes a drain region, doped with impurities of a first conductivity type, formed near the bottom surface. The MOSFET device further includes a plurality of vertical cells wherein each of the vertical cell includes a vertical pn-junction zone region includes a lower-outer body region, doped with impurities of a second conductivity type, formed on top of the drain region. The pn-junction region further includes a source region, doped with impurities of the first conductivity type, formed on top of the lower-outer body region, the lower-outer body region surrounding the source region forming a channel region extending from the source region to the drain region near the top surface. The vertical cell further includes a source contact formed on the top surface contacting the source region. The MOSFET device further includes a plurality of extended gates, formed with mobile ion insulating materials, wherein each extended gate formed on top of the top surface extending from an area near a boundary of the source region and the lower-outer body region of one of the cells to a neighboring cell, the gate includes a thin insulative bottom layer for insulating from the vertical cell, the gate is provided for applying a voltage thereon for controlling a charge state of a channel underneath each of the gates thus controlling a vertical current from the source contact to the drain region. The MOSFET device further includes a plurality of metal contacts formed on top of the gates and sources, the metal contacts former forming a field plate and a equal potential ring on top of the semiconductor chip in a terminal area, wherein a plurality of mobile-ion gaps between the source contacts and the gate contacts, between the gate contacts and the field plate, and between the field plate and the equal potential ring, are covered by the extended gates and extended metal contacts in the termination area whereby a passivation layer for insulating mobile ion from entering into the MOSFET device via the gaps is eliminated.

In another preferred embodiment, the metal contacts in the termination area forming the field plate, and the EQR are further expanded for covering the gaps to prevent the mobile ions from entering the MOSFET device therefrom. In yet another preferred embodiment, the power MOSFET device 100 is protected by a LPCVD nitride layer prior to the deposition of a PSG, or BPSG layer or the PSG/BPSG composite intermediate layer such that the processing steps can be simplified without requiring a passivation layer. The LPCVD nitride layer is an excellent barrier to block the mobile ions from entering into the MOSFET cells through the gaps.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
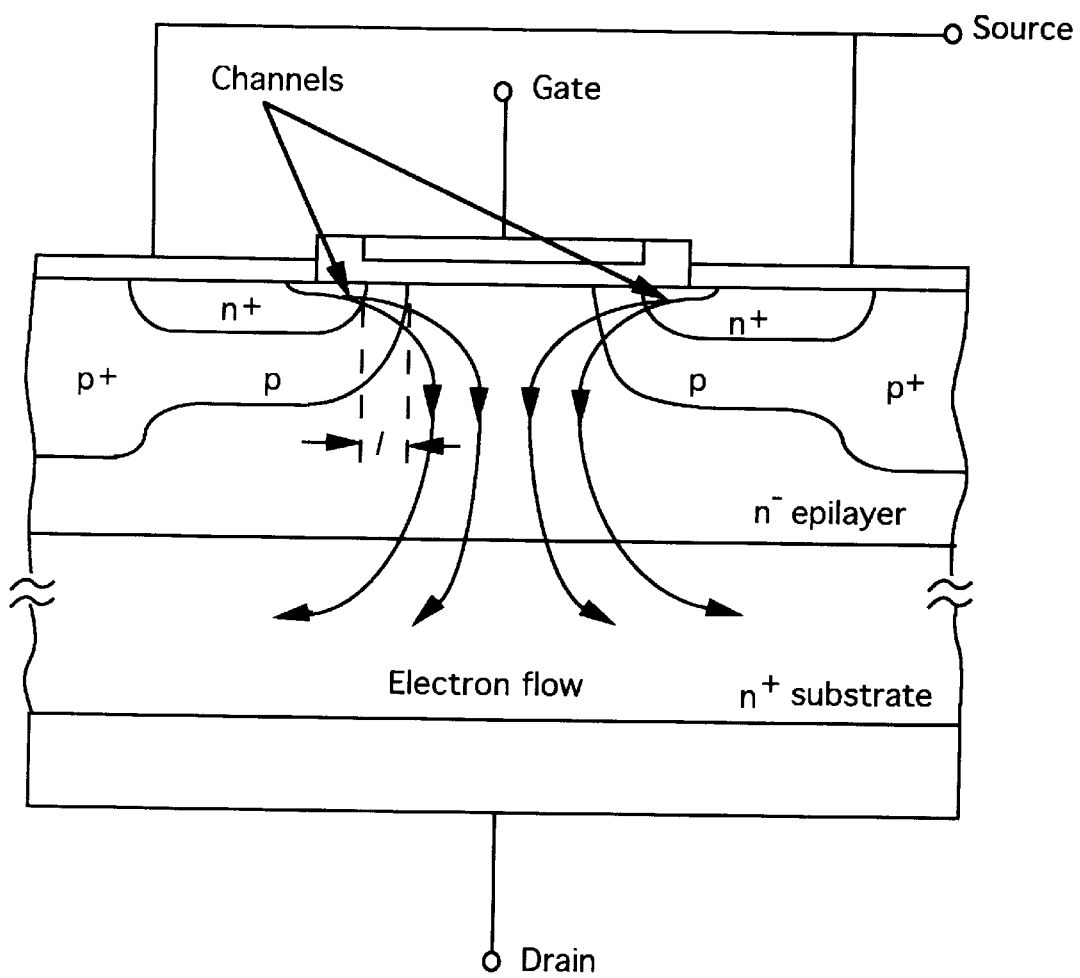
FIG. 1 is a cross-sectional view of a prior art structure of a general MOSFET.
Figure 2A:
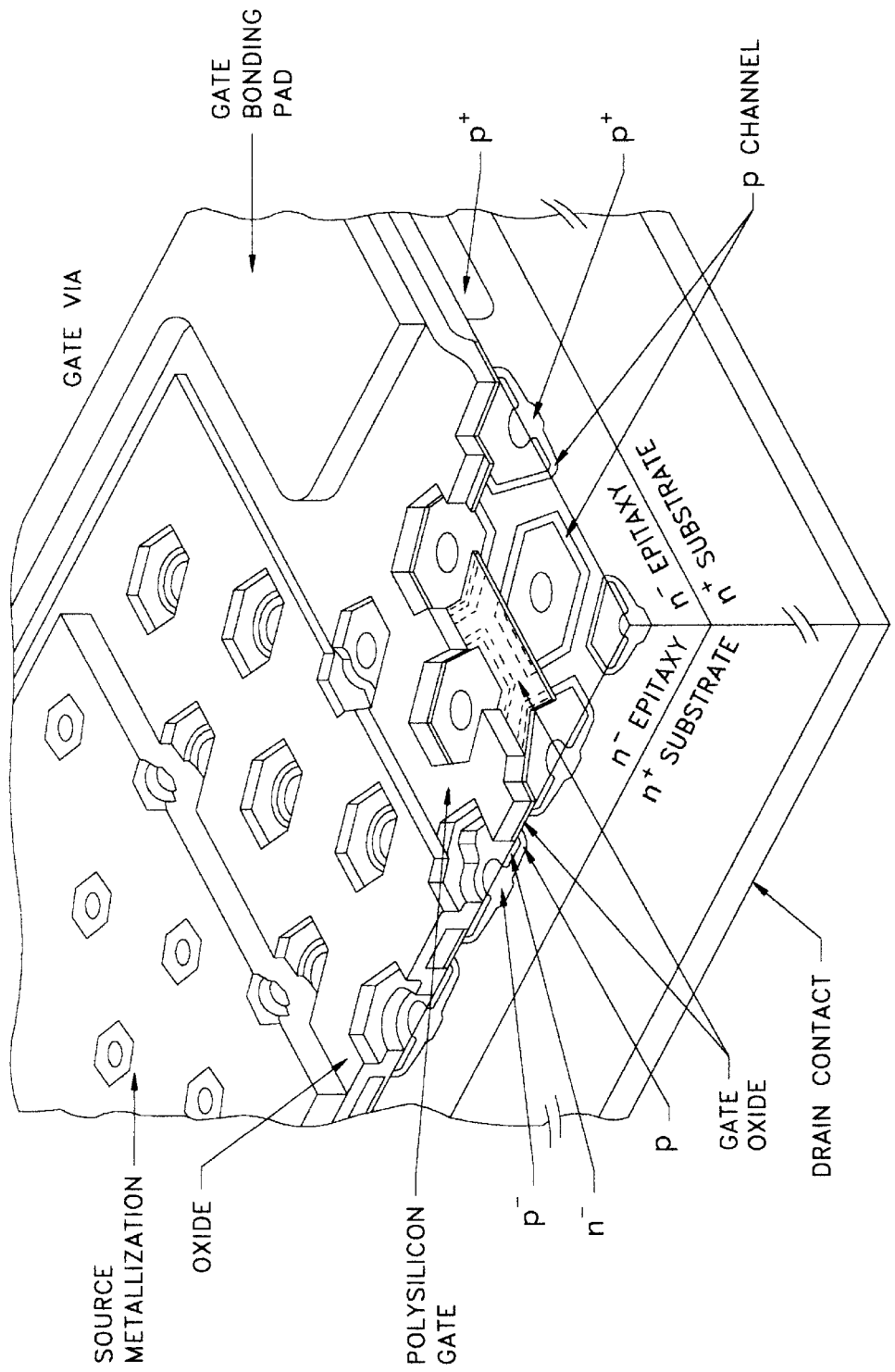
FIGS. 2A to 2B are partial perspective views of the layer structure of a prior art hexagonal and square MOSFET respectively.
Figure 2B:
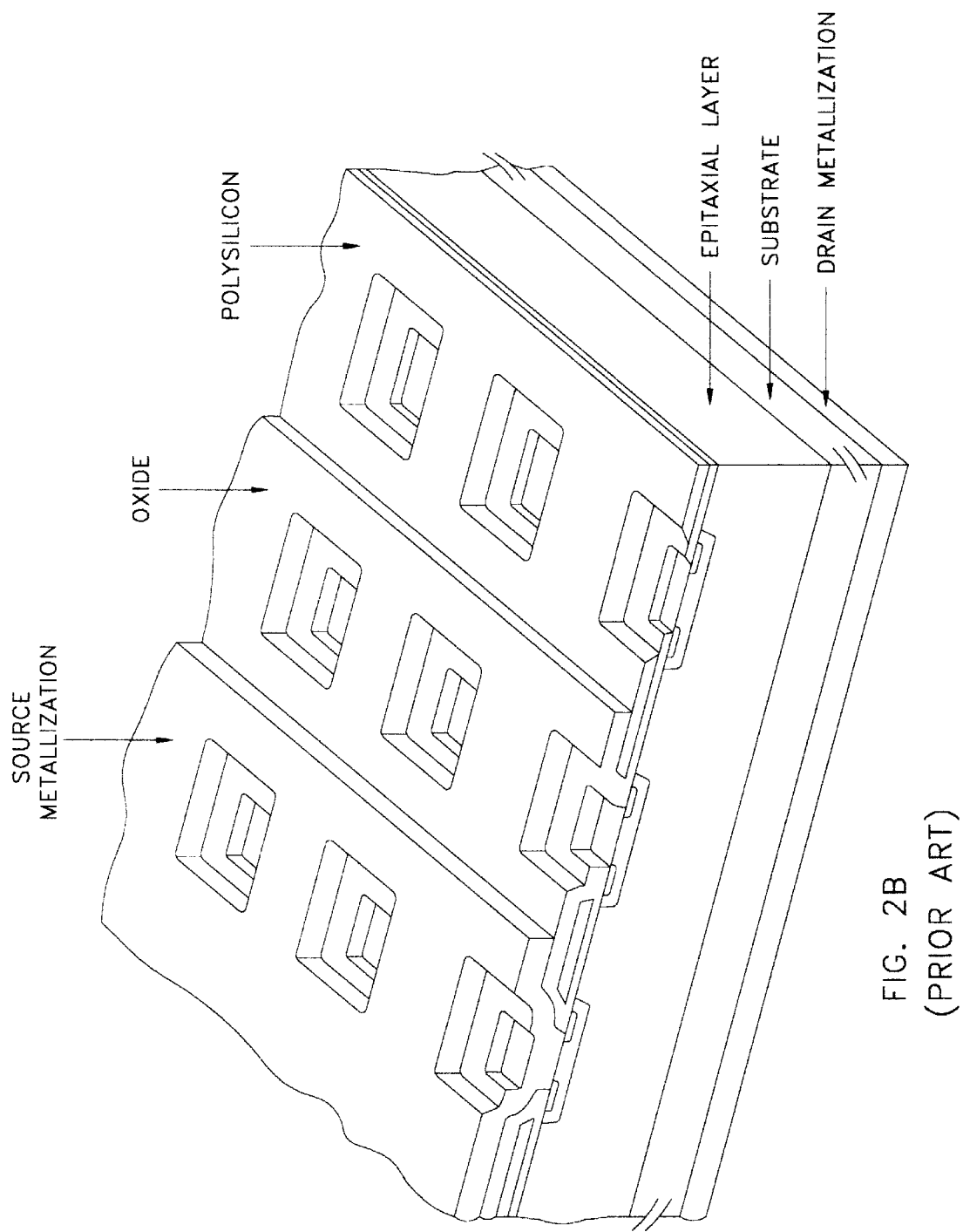
Figure 3:
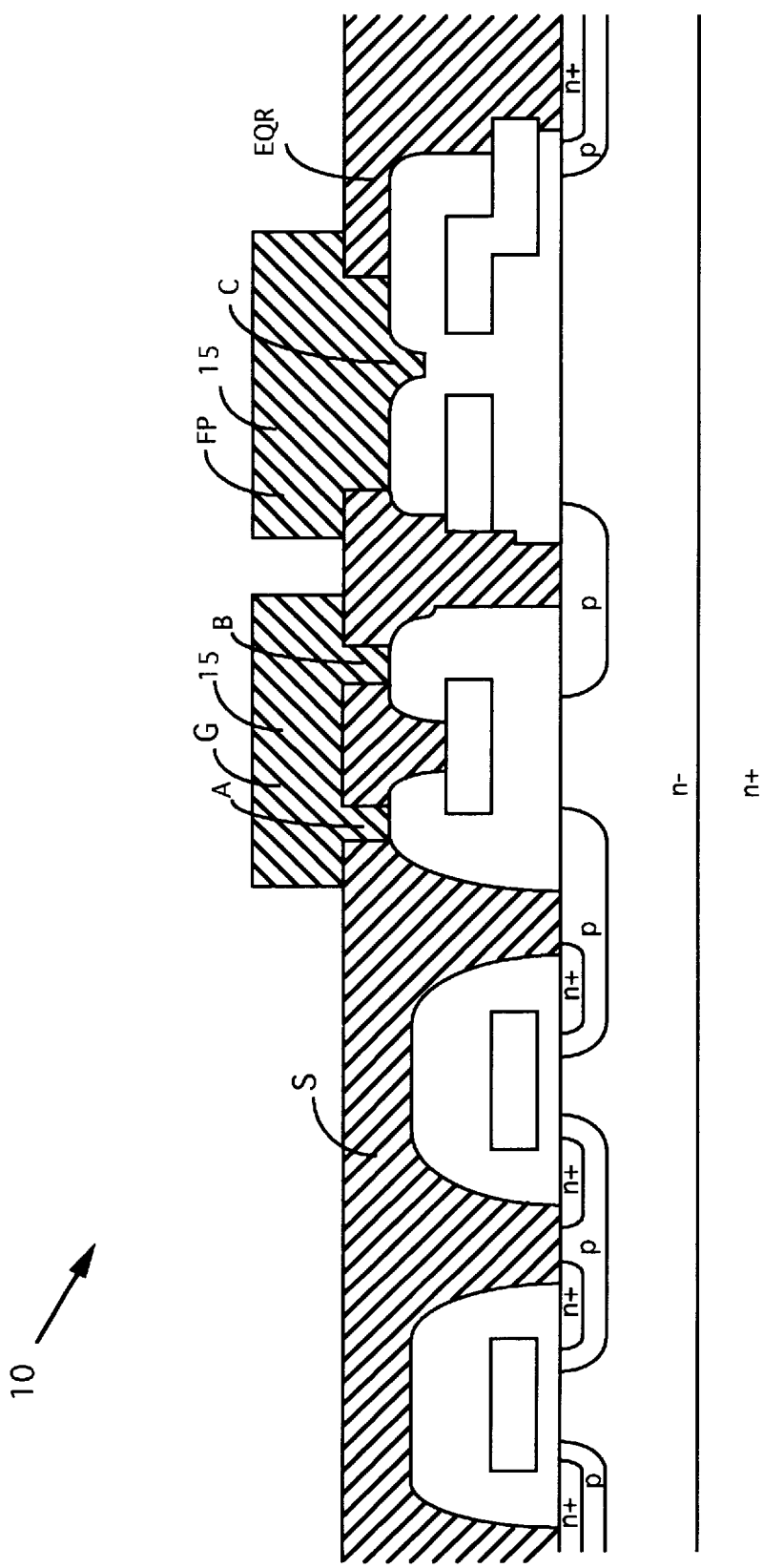
FIGS. 3 shows a cross sectional view of a prior art MOSFET device where passivation layer and field plate are required.
Figure 4:
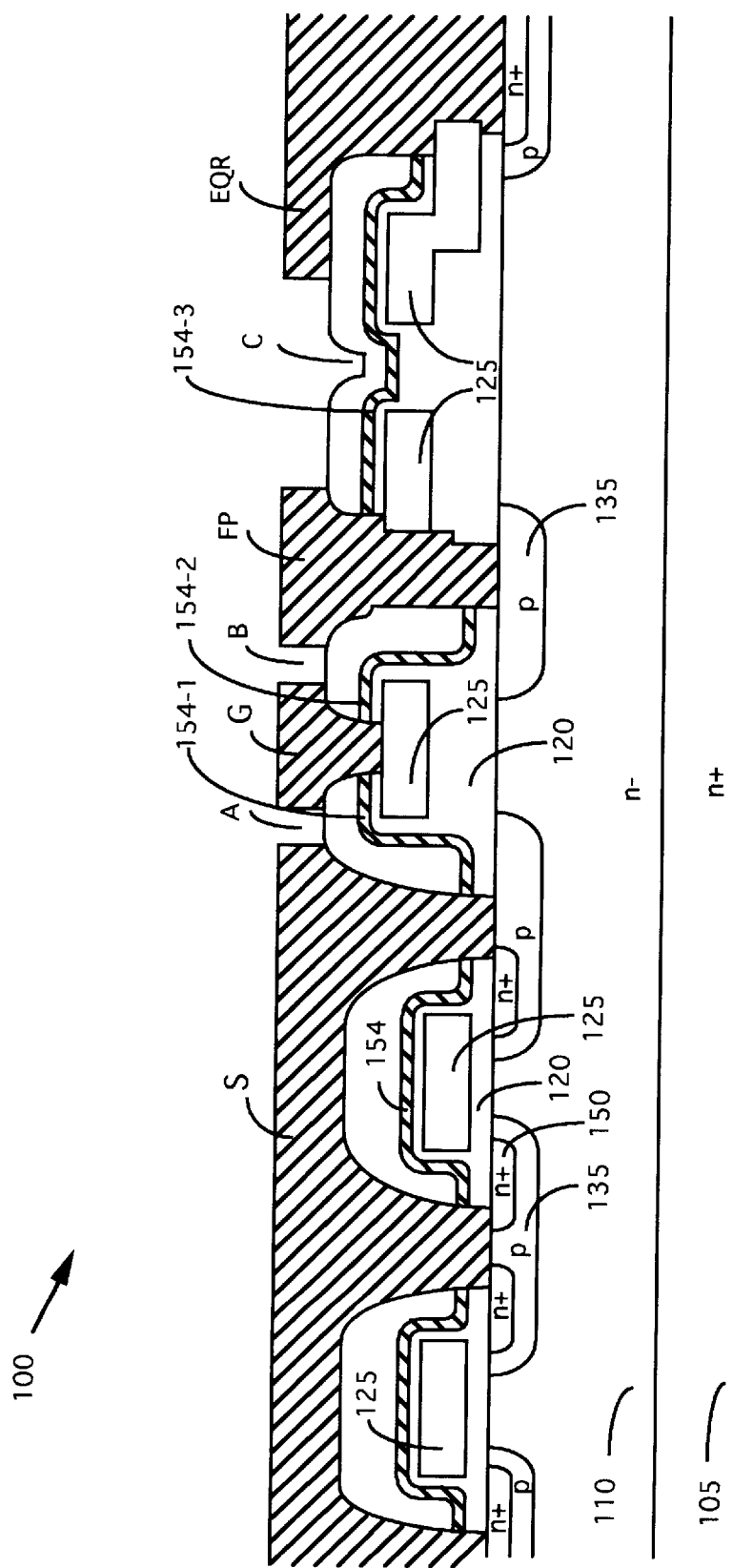
FIG. 4 is a cross sectional view of a MOSFET device of the present invention wherein the passivation layer requirement is eliminated.

FIG. 4 shows a cross sectional view of a first preferred embodiment of a power MOSFET device 100 of the present invention. The device 100 is supported on a n+ substrate 105 with an n– doped epitaxial drain region 110. A plurality of p-body regions 135 and n+ source regions 150 are formed on top of the drain regions 110. A plurality of polysilicon gates 125 each insulated by a layer of gate oxide 120 are formed on the top surface of the semiconductor chip supported by the substrate 105. As shown in FIG. 4, a nitride layer 154 is formed to cover gate surfaces, i.e., the nitride layer 154-1, covering the open areas A, i.e., the nitride layer 154-2, covering the open areas B, i.e., the nitride layer 154-3, and covering the open area C. The nitride layer 154 is an excellent barrier for preventing the mobile ions from entering into the MOSFET device from the gaps A, B, and C. In addition to the elimination of the passivation layer, when compared with that of a conventional device structure, the benefits of this novel cell structure can be readily appreciated by referring to the simplified processing steps in eliminating the requirement of a mask for forming the passivation layer as described below.

Figure 5A:
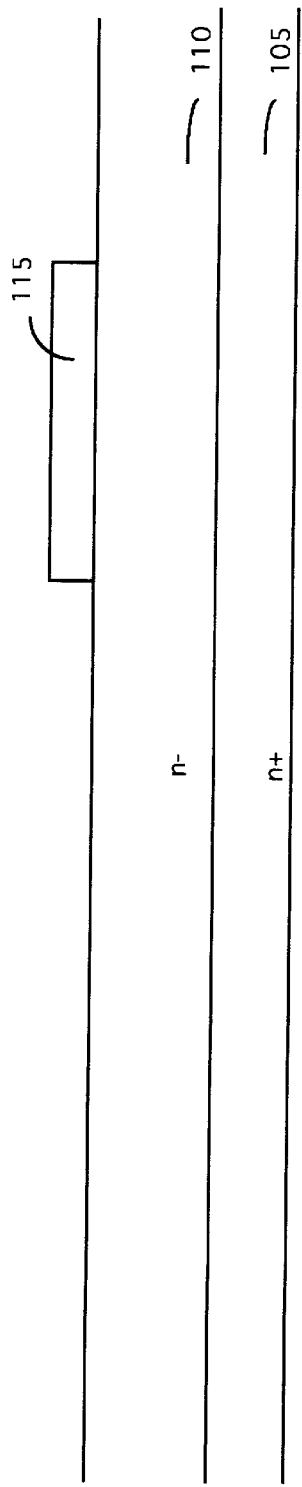
FIGS. 5A to 5D show the processing steps of manufacturing a power MOSFET device of FIG. 4.

Please refer to FIGS. 5A to 5D for the processing steps for manufacturing the power MOSFET device 100 described above. As shown in FIG. 5A, the processing steps begins by first growing a N⁻ epitaxial layer 110 with a resistivity ranging from 0.1 to 1.0 ohm-cm on top of a N⁺ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epilayer 110 is about six to eight microns (6–8$\mu$m). An initial oxide layer 115 of thickness in the range of 5,000 to 10,000 Å is grown which is then etched by applying an mask to define the active areas.

Figure 5B:
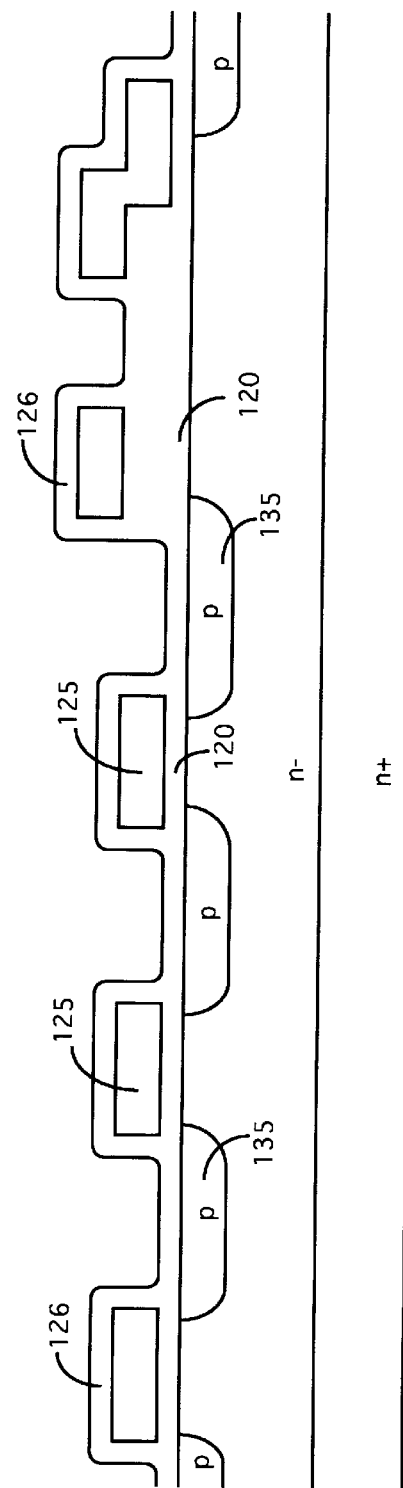

Referring to FIG. 5B, where a gate oxidation process is first carried out to form a gate oxide layer 120. A polysilicon layer 125 is then deposited on the gate oxide layer 120. A POCL$_3$ doping process is carried out followed by an Arsenic (As)-implant process with an ion beam of energy at 60–80 Kev with a flux density of 5 to $8 \times 10^{15}/cm^2$. A poly mask is then applied to carry out the an anisotropic etching process to define the poly gate 125. The resist is stripped and a p-body mask is applied to perform a p-body implant at 30–100 Kev with an ion beam of $3 \times 10^{13}$ to $3 \times 10^{14}/cm^2$ flux density to form the p-body region 135. A p-body diffusion process is then carried out at an elevated temperature of 1,000–1,200° C. for ten minutes to three hours to increase the depth of the p-body region 135 to 1.0–2.0$\mu$. A thin silicide layer 126 is then formed on the top surface.

Figure 5C:
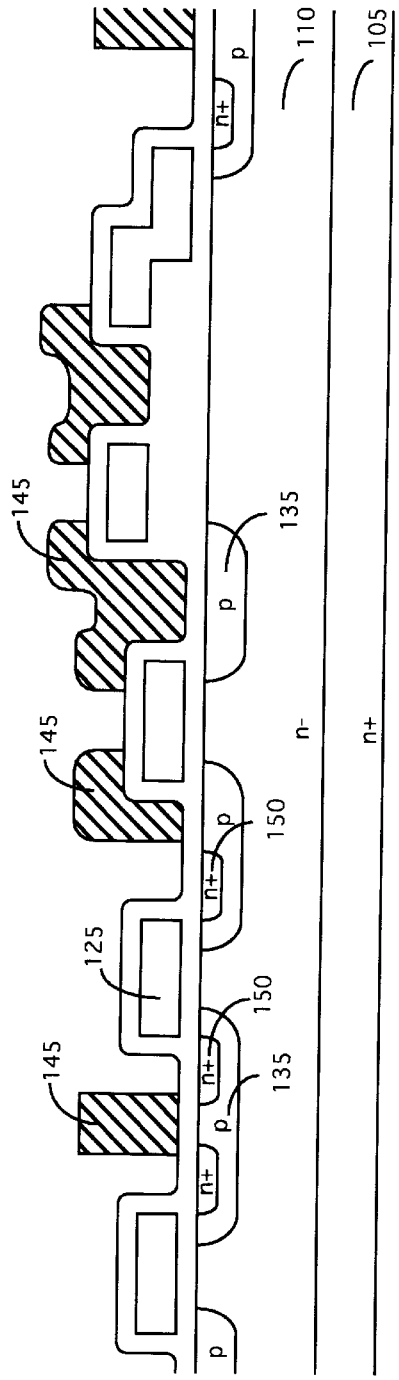

Referring to FIG. 5C, a N+ block mask 145 is applied to carry out an N+ implant to form the N+ region 150. The N⁺ implantation is carried out with an ion beam at an energy of 60–100 Kev and ion flux density of $5 \times 10^{15}$ to $1 \times 10^{16}/cm^2$. After the resist, i e., the N⁺ blocking mask 145, is stripped, the N+ source regions 150 are driven into desired junction depth ranging from 0.2 to 1.0$\mu$ by a diffusion process.

Figure 5D:
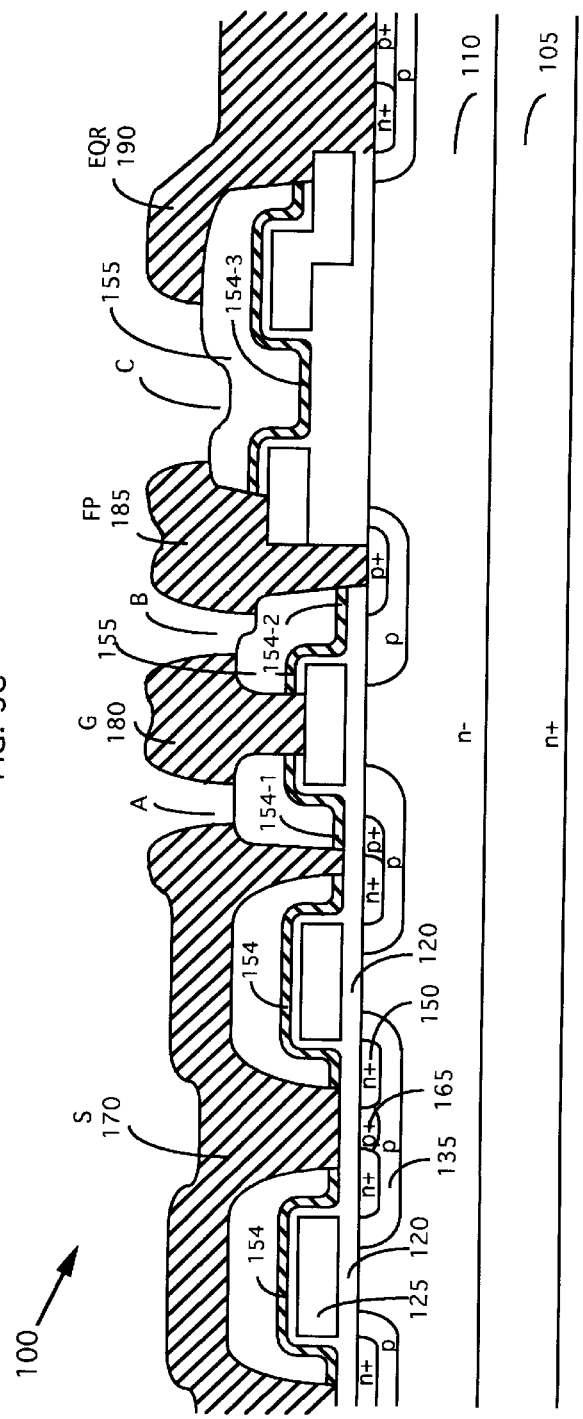

Referring to FIG. 5D, a low pressure chemical vapor deposition (LPCVD) nitride is first carried out to form a nitride layer 154 to cover the entire surface thus without requiring a special mask. As that shown in FIG. 4, this nitride layer 154 is kept unremoved in subsequent processing steps and covering the gate surfaces, i.e., the nitride layer 154-1, covering the open areas A, i.e., the nitride layer 154-2, covering the open areas B, i.e., the nitride layer 154-3, and covering the open areas C, i.e., the nitride layer 154-4. A BPSG or PSG is deposited to form a layer 155 of approximately 5000–15,000 Å in thickness. A BPSG flow or PSG densification process is performed at 900–950° C. for thirty minutes to one hour. A contact mask is applied to perform an etching process to define the contacts. A p+ ion implantation is carried out to form the p+ region 165 by a p+ activation process at 900–950° C. in an oxidation or inert gas ambient The final power MOSFET device 100 is completed with the metal deposition and metal etching with a metal mask to define the source contact 170, the gate contacts 180, the field plate 185 and equal potential ring (EQR) 190.

The device 100, shown above is protected with a LPCVD nitride layer 154 prior to the deposition of PSG or BPSG layer or the PSG/BPSG composite intermediate layer 155. The LPCVD nitride layer is an excellent barrier to block the mobile ions. As shown in FIG. 4, other than the possible contamination openings A, B, C, the source (S), gate (G), the field plate, and the equal potential ring surface areas, are protected by the nitride layer 154. The device is protected from ion contamination without requiring a passivation layer and additional pad masking steps. Cost savings are achieved by this device structure because the process of performing a LPCVD deposition of the nitride layer 154 over the entire surface greatly simplified the processing steps and eliminating the need of an additional pad mask and pad etching steps for forming a passivation layer as that required in a conventional MOSFET device structure.

In summary, the present invention discloses a MOSFET device 100 formed in a semiconductor chip 105 with a top surface and a bottom surface. The MOSFET device 100 includes a drain region 110, doped with impurities of a first conductivity type, formed near the bottom surface. The MOSFET device 100 further includes a plurality of vertical cells wherein each of the vertical cell includes a vertical pn-junction zone region which includes a lower-outer body region 135, doped with impurities of a second conductivity type, formed on top of the drain region 110. The pn-junction region further includes a source region 150, doped with impurities of the first conductivity type, formed on top of the lower-outer body region 135, the lower-outer body region 135 surrounding the source region 150 forming a channel region extending from the source region 150 to the drain region 110 near the top surface. The vertical cell further includes a source contact 170 formed on the top surface contacting the source region 150. The MOSFET device 100 further includes a plurality of gates 125 wherein each gate 125 formed on top of the top surface extending from an area near a boundary of the source region 150 and the lower-outer body region 135 of one of the cells to a neighboring cell, the gate 125 includes a thin insulative bottom layer 120 for insulating from the vertical cell, the gate 125 is provided for applying a voltage thereon for controlling a charge state of a channel underneath each of the gates 125 thus controlling a vertical current from the source contact 170 to the drain region 110. The MOSFET device 100 further includes a plurality of metal contacts formed on top of the gates 125 and sources 150, the metal contacts further forming a field plate 185 and a equal potential ring 190 on top of and covering a termination area on the semiconductor chip, wherein a plurality of mobile-ion gaps between the source contacts and the gate contacts, i.e. gap A, between the gate contacts and the field plate, i.e., gap B, and between the field plate and the equal potential ring, i.e., gap C, are covered by a mobileion insulating layer 154 formed below said metal contact whereby a passivation layer for insulating mobile ion from entering into said MOSFET device 100 via said gaps, i.e., gaps A, B, and C, is eliminated.

Figure 6:
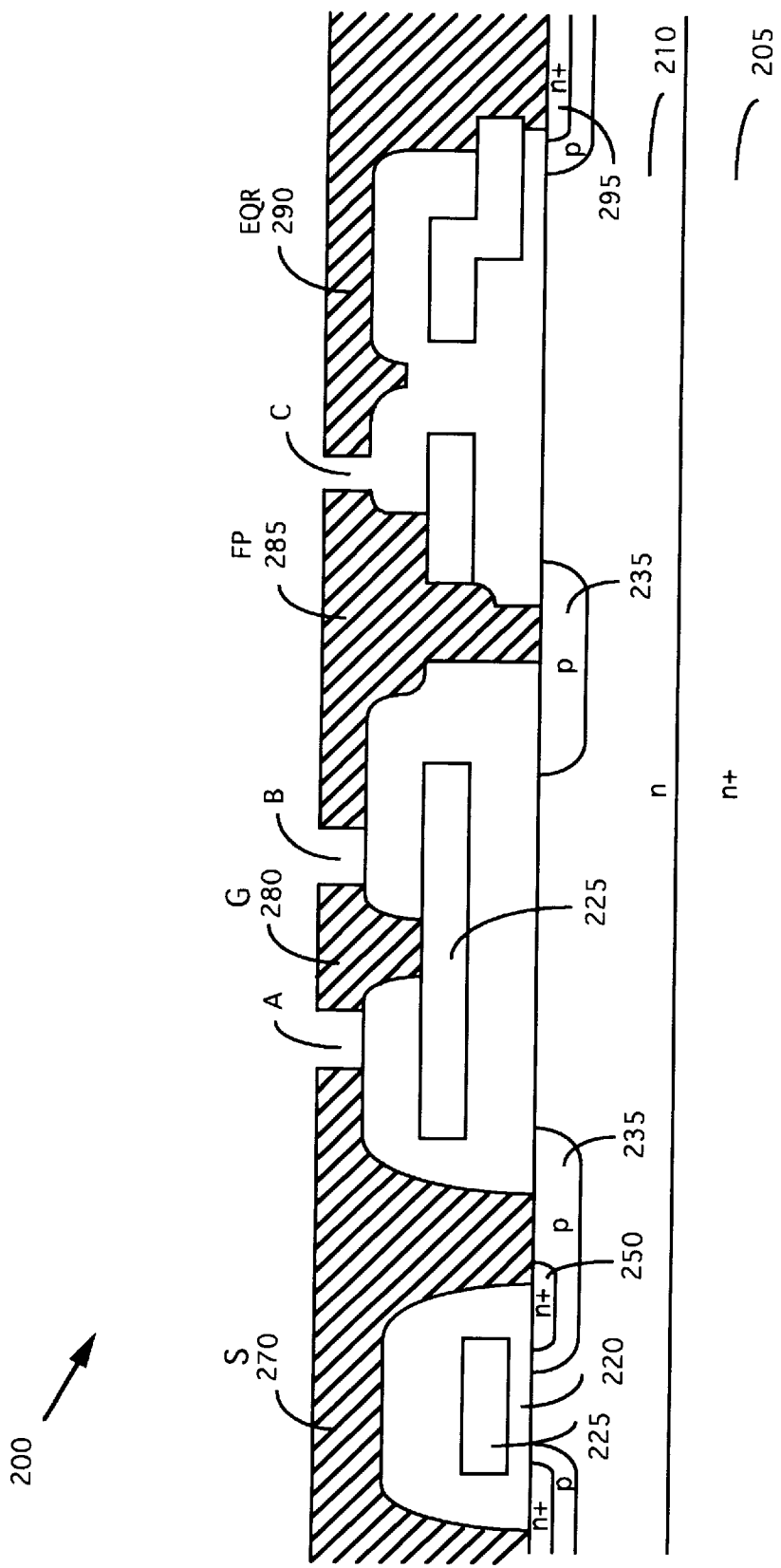
FIGS. 6 and 7 are the cross sectional views of two MOSFET devices of the present invention with extended gate poly and expanded metal contact in the termination area to eliminate the requirement of a passivation layer.

FIG. 6 shows an alternate preferred embodiment of a MOSFET device 200. The improvement of this device 200 is achieved by expanding the areas covered by the polysilicon 225 such that all the device areas the core-cell, i.e., the p-body regions 235, the source regions 250, and the drain regions 210, the poly fingers 280, the field plate 285, the equal potential ring 290, and the channel stops 295, are covered with either metal or polysilicon layer 225. Passivation layer and additional pad masking steps can be eliminated in this structure to achieve cost savings without causing reliability concerns with this novel design improvement. The processing steps for manufacturing the MOSFET device is the same as that of MOSFET 100 except that the step of LPCVD deposition of a nitride layer 154 described above is no longer necessary. By expanding the areas covered by the polysilicon layer 225, and the metal contacts covering the termination areas, the metal contacts as the field plate 285, and the EQR 290, the requirement for a passivation layer is eliminated.

Figure 7:
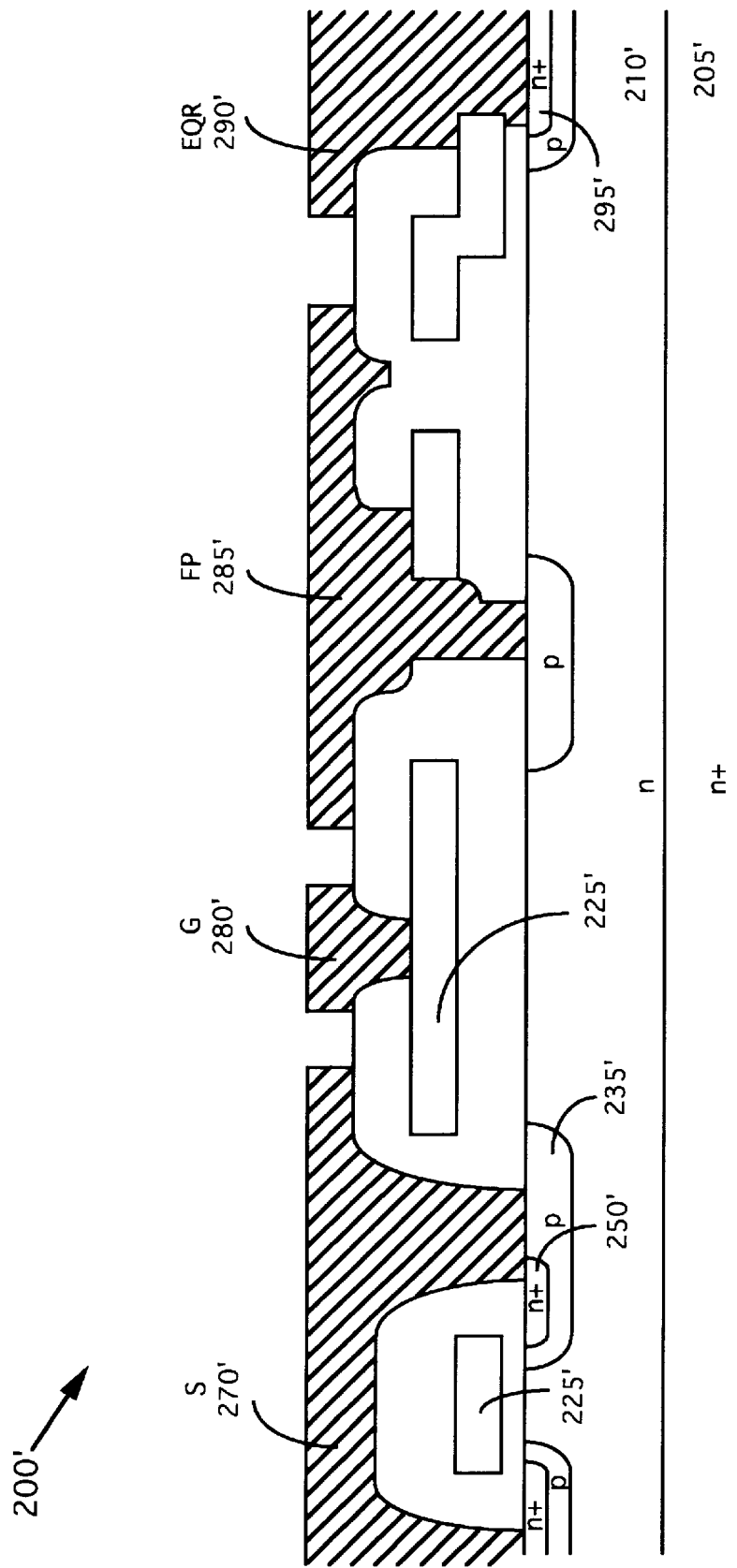

FIG. 7 shows an alternate preferred embodiment of a MOSFET device 200' similar in structure as that for device 200 shown in FIG. 6. The only difference of device 200' from that of device 200 is the termination areas covered by the field plate 285' is expanded while the areas covered by the EQR 290' is proportionally reduced such that all the device areas the core cells, i.e., the p-body regions 235', the source regions 250', and the drain regions 210', the gate contact 280', the field plate 285', the equal potential ring 290', and the channel stops 295', are covered with either metal or polysilicon layer 225'. Again, in this device 200', the requirement for protection by the use of a passivation layer is eliminated.

The novel structure disclosed in the MOSFET devices 200 and 200' takes advantage of the facts that the major purposes of passivation layers such as nitride and PSG are to reduce potential mechanical damages and to prevent the device from being contaminated by mobile ions. Because usually more than 80% of the surface areas of a power MOSFET device is covered with a thick metal layer, the potential reliability problem caused by mechanical damage is very minimal. The major concern is the contamination of mobile ions. The novel structures are to prevent mobile ion contamination without requiring passivation layer and additional masking step to achieve cost savings in device fabrication.

In summary, the present invention includes a MOSFET device 200 formed in a semiconductor chip 205 with a top surface and a bottom surface. The MOSFET device 200 includes a drain region 210, doped with impurities of a first conductivity type, formed near the bottom surface. The MOSFET device 200 further includes a plurality of vertical cells wherein each of the vertical cell includes a vertical pn-junction zone region which includes a lower-outer body region 235, doped with impurities of a second conductivity type, formed on top of the drain region 210. The pn-junction region further includes a source region 250, doped with impurities of the first conductivity type, formed on top of the lower-outer body region 235, the lower-outer body region 235 surrounding the source region 250 forming a channel region extending from the source region 250 to the drain region 235 near the top surface. The vertical cell further includes a source contact 270 formed on the top surface contacting the source region 250. The MOSFET device 200 further includes a plurality of extended gates 225, formed with mobile ion insulating materials, wherein each extended gate 225 formed on top of the top surface extending from an area near a boundary of the source region 250 and the lower-outer body region 235 of one of the cells to a neighboring cell, the gate includes a thin insulative bottom layer 220 for insulating from the vertical cell, the gate 225 is provided for applying a voltage thereon for controlling a charge state of a channel underneath each of the gates 225 thus controlling a vertical current from the source contact to the drain region. The MOSFET device 200 further includes a plurality of metal contacts formed on top of the gates and sources, the metal contacts further forming a field plate 285 and a equal potential ring 290 on top of and covering a termination area on the semiconductor chip, wherein a plurality of mobile-ion gaps between the source contacts and the gate contacts, i.e., area A, between the gate contacts and the field plate, i.e., area B, and between the field plate and the equal potential ring, i.e., area C, are covered by the extended gates 225 and the metal contacts, including expanded field plate 285 and expanded EQR 290 in the termination area, whereby a passivation layer for insulating mobile ion from entering into the MOSFET device 200 via the gaps, i.e., gaps A, B, and C, is eliminated.

Figure 8:
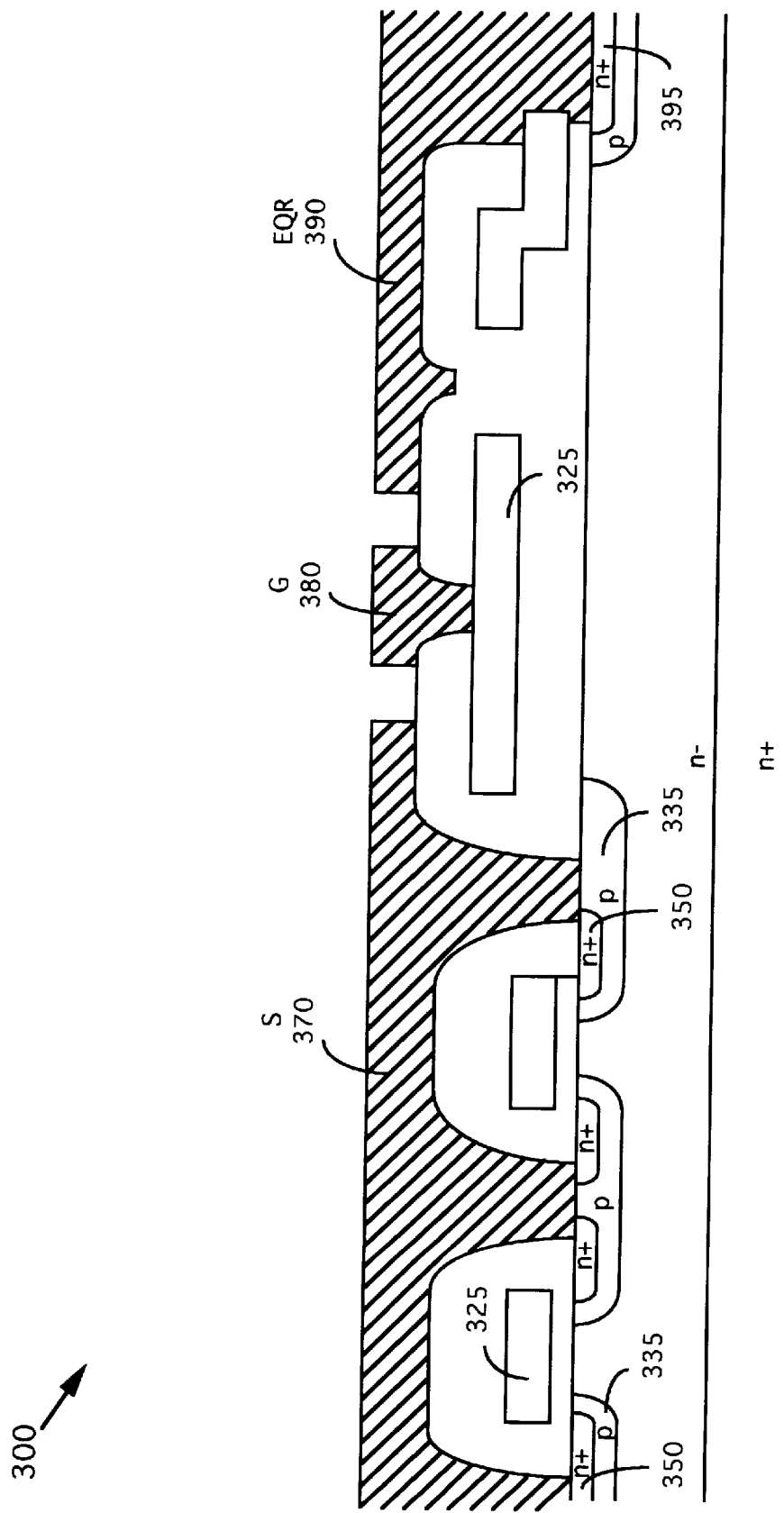
FIGS. 8 and 9 are the cross sectional views of two new MOSFET devices of the present invention where the requirements of forming a field plate and the passivation layer are eliminated.
Figure 9:
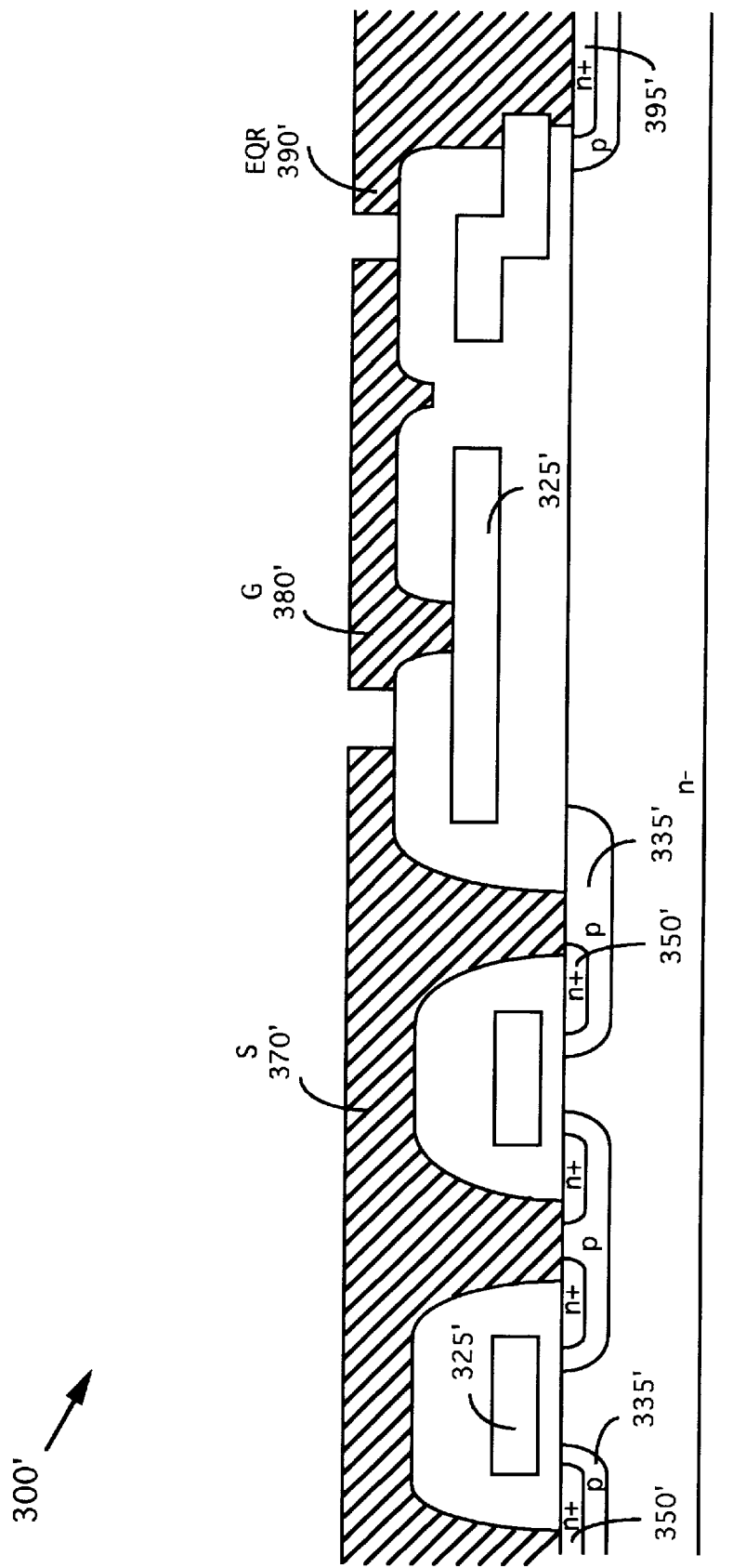

Further improvement for achieving cost savings in power MOSFET devices is shown in FIGS. 8 and 9 where the cross sectional views of two alternate MOSFET devices 300 and 300' are shown respectively without requiring the use of a field plate 285. The difference between the device 300 and 300' is the widths of the gate contact 380 and the EQR 390. In FIG. 8, the width of the EQR 390 is extended while in FIG. 9, the gate contact 380 is extended. Since the structure of the core-cell including the source regions 350, the p-body regions 335, the gates 325, the source contact 370 are all identical to that shown in FIGS. 6 and 7. These elements are not described in further details for the sake of avoiding repetition. In both MOSFET devices 300 and 300', gate runner is now used to replace the field plate 285. Elimination of the field plate 285 is possible because of two major reasons. First, for low voltage application the function served by the field plate 285 becomes less effective as the breakdown voltage decreases. Additionally, for logic application, the gate on-state bias is so much less than the breakdown voltage such that, on a relative scale and for all practical purposes, the gate bias can almost be applied as a ground voltage. Therefore, the gate runner can be employed to replace the function previously served by the field plate. Taking advantage of these special features in the design and manufacture of a low voltage MOSFET devices 300 and 300' which are intended for logic type of applications, the field plate 285 can now be eliminated to reduce the die size thus lowering the manufacture cost even more. Additional cost savings in MOSFET device production are therefore achieved by a new device structure with the field plate 285 removed.

Therefore, the present invention provides an improved MOSFET structure, and fabrication process to overcome the limitations encountered in the prior art. Specifically, in a preferred embodiment of the present invention, the passivation layer is no longer required such that the fabrication process is simplified and the MOSFET device can be manufactured at a lower cost. Furthermore, in another preferred embodiment, the requirement of a field plate as that in a conventional MOSFET device is eliminated such that the cost of manufacture can be further reduced.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A MOSFET device supported on a substrate covered by an epitaxial layer thereon provided as a drain for said MOSFET device, the MOSFET device comprising:

a core cell area and a termination area opposite said core cell area wherein said core cell area includes a plurality of MOSFET cells each having a gate overlaying a source region near an outer edge of said gate disposed within a body region in said epitaxial layer wherein said body region extends laterally between said gates;

each of said gates being covered with an insulation layer thus leaving source contact openings therein, each of these openings being filled with a metal source contact deposited therein;

said termination area includes a polysilicon layer disposed over a top surface of said epitaxial layer;

said termination area being covered by said insulation layer includes a plurality of contact openings opened through said insulation layer and a plurality of metal contacts each deposited in a corresponding contact opening for contacting the MOSFET device provided as a gate contact, and an equalization potential ring;

said gate contact in said termination area being connected to a ground voltage whereby said power device is provided to operate without a field plate; and wherein said polysilicon layer and said equalization potential ring covered the entire top surface of said termination area.

* * * * *